United States Patent [19]

Kimura

[11] Patent Number: 5,421,695
[45] Date of Patent: Jun. 6, 1995

[54] TRANSFER APPARATUS AND METHOD

[75] Inventor: Masayuki Kimura, Kawasaki, Japan

[73] Assignee: Fujitsu Limited, Japan

[21] Appl. No.: 115,769

[22] Filed: Sep. 3, 1993

[30] Foreign Application Priority Data

Sep. 4, 1992 [JP] Japan .................. 4-237199
Aug. 12, 1993 [JP] Japan .................. 5-200735

[51] Int. Cl.⁶ ............................... B25J 9/06
[52] U.S. Cl. ...................... 414/744.5; 414/749;
414/935; 414/786; 901/15; 901/23; 74/490.03
[58] Field of Search ............... 414/744.5, 749, 751,
414/752, 753, 935, 786; 901/23, 24, 15;
104/292, 290; 74/749 BP, 749 PF, 749 PH

[56] References Cited

U.S. PATENT DOCUMENTS 4,624,617 11/1986 Belna ...................... 414/935 X
4,712,971 12/1987 Fyler ...................... 901/15 X
5,195,866 3/1993 Hasegawa et al. ......... 414/744.5 X Primary Examiner—Donald W. Underwood
Attorney, Agent, or Firm—Staas & Halsey

[57] ABSTRACT

A transfer apparatus for moving a transfer stage. Two pairs of links are joined by a first pair of shafts. Each pair of links includes two arms joined together by a corresponding, respective shaft of the first pair of shafts. A second pair of shafts are driven by a driving unit. Each shaft of the second pair of shafts corresponds to a respective pair of links of the two pair of links and is attached to a first end of the corresponding pair of links. A third pair of shafts supports the transfer stage, each shaft of the third pair of shafts corresponding to a respective pair of links of the two pair of links and being attached to a second end of the corresponding pair of links. The second pair of shafts is inclined with respect to a perpendicular direction to the transfer direction of the transfer stage, to form an angle between the shafts of the second pair of shafts. One shaft of the first pair of shafts, one shaft of the third pair of shafts and one shaft of the second pair of shafts are parallel to each other. The other shaft of the first pair of shafts, the other shaft of the third pair of shafts and the other shaft of the second pair of shafts are parallel to each other. A magnetic unit exerts a force on the transfer stage to start a movement of the transfer stage.

11 Claims, 11 Drawing Sheets

TRANSFER APPARATUS AND METHOD

BACKGROUND OF THE INVENTION

1. Field of the Invention

The present invention relates to a transfer apparatus having a link mechanism.

A wafer transfer apparatus used in the production of semiconductor devices requires that a wafer is transferred so that unwanted particles are prevented from being deposited on the wafer during the wafer transfer process. Particularly, an increase in the integration density of semiconductor devices limits the allowable values of the number and size of dust particles deposited on the wafer. Hence, it is required to prevent the existence particles in the wafer transfer apparatus and to diminish the size of the wafer transfer apparatus.

2. Description of the Prior Art

FIG. 1A is a plan view of an essential part of a conventional transfer apparatus, and FIG. 1B is a side view thereof. The transfer apparatus shown in FIGS. 1A and 1B has two driving shafts 12a and 12b mounted on a horizontal plane of a driving unit 11. Respective ends of a first pair of arms 13a and 13b are attached to the driving shafts 12a and 12b. Other ends of the first pair of arms 13a and 13b are respectively connected to a second pair of arms 15a and 15b by means of first rotary shafts 14a and 14b. Gears 16a and 16b engaging each other are fixed to other ends of the second pair of arms 15a and 15b. The other ends of the arms 15a and 15b as well as the gears 16a and 16b are fastened to a second pair of rotary shafts 18a and 18b mounted on a horizontal transfer stage 17.

In the operation of the above transfer apparatus, the driving shafts 12a and 12b are rotated by the driving unit 11, and hence a link mechanism made up of the four arms 13a, 13b, 15a and 15b moves the transfer stage 17 in the direction indicated by a two-headed arrow. The gears 16a and 16b function to equalize the turning angles of the first pair of arms 13a and 13b. More particularly, the two driving shafts 12a and 12b and the two second rotary shafts 18a and 18b are parallel to each other, and hence the turning angles of the first pair of arms 13a and 13b and the second pair of arms 15a and 15b are made to coincide with each other.

For the above-mentioned reason, the gears 16a and 16b are needed. However, there is a disadvantage in that particles are generated due to engagement of the gears 16a and 16b and are deposited to a wafer mounted on the transfer stage 17. Further, the gears 16a and 16b are structural parts of the transfer stage 17, and hence the first and second pairs of arms 13a, 13b, 15a and 15b of sufficient thickness and stiffness to support the transfer stage 17 and the gears 16a and 16b. This requires a large movement area within which the arms 13a, 13b, 15a and 15b and the transfer stage 17 are moved.

SUMMARY OF THE INVENTION

It is a general object of the present invention to provide a transfer apparatus in which the above disadvantages are eliminated.

A more specific object of the present invention is to provide a light, small transfer apparatus having a mechanism in which unwanted particles are not generated.

The above objects of the present invention are achieved by a transfer apparatus comprising: two pairs of links, each of the pairs of links having two arms joined together by means of one of a first pair of rotary shafts; a driving unit; a second pair of driving shafts driven by the driving unit and attached to a first side of the two pairs of links; a third pair of rotary shafts attached to a second side of the two pairs of links opposite to the first side thereof; and a transfer stage supported by the third pair of rotary shafts. The second pair of driving shafts are inclined with a vertical direction perpendicular to a transfer direction in which the transfer stage is moved, so that the driving shafts of the second pair forms an angle. One of the first pair of rotary shafts and one of the third pair of rotary shafts are parallel to one of the second pair of the driving shafts. The other one of the first pair of rotary shafts and the other one of the third pair of rotary shafts are parallel to the other one of the second pair of the driving shafts.

The above objects of the present invention are also achieved by a transfer apparatus comprising: an intermediate link structure which is stretchable and contractible and which includes a plurality of pairs of links, each of the pairs of links having a pair of arms joined together by means of an intermediate rotary shaft; a first pair of arms rotatably coupled to a first side of the intermediate link structure; a second pair of arms rotatably coupled to a second side of the intermediate link structure opposite to the first side thereof; a driving unit; a first pair of driving shafts driven by the driving unit and attached to the first pair of arms; a second pair of rotary shafts attached to the second pair of arms; and a transfer stage supported by the second pair of rotary shafts. The first pair of driving shafts is inclined with a vertical direction perpendicular to a transfer direction in which the transfer stage is moved, so that the driving shafts of the first pair forms an angle. One of the second pair of rotary shafts is parallel to one of the first pair of the driving shafts. The other one of the second pair of rotary shafts is parallel to the other one of the first pair of the driving shafts.

The above objects of the present invention are also achieved by a transfer apparatus comprising: two pairs of links, each of the pairs of links having two arms joined together by means of one of a first pair of rotary shafts; a driving unit; a second pair of driving shafts driven by the driving unit and attached to a first side of the two pairs of links; a third pair of rotary shafts attached to a second side of the two pairs of links opposite to the first side thereof; a transfer stage supported by the third pair of rotary shafts; and means for magnetically generating a force exerted on the transfer stage in order to determine a direction of movement of the transfer stage.

The above objects of the present invention are also achieved by a transfer apparatus comprising: an intermediate link structure which is stretchable and contractible and which includes a plurality of pairs of links, each of the pairs of links having a pair of arms joined together by means of an intermediate rotary shaft; a first pair of arms rotatably coupled to a first side of the intermediate link structure; a second pair of arms rotatably coupled to a second side of the intermediate link structure opposite to the first side thereof; a driving unit; a first pair of driving shafts driven by the driving unit and attached to the first pair of arms; a second pair of rotary shafts attached to the second pair of arms; a transfer stage supported by the second pair of rotary shafts; and means for magnetically generating a force exerted on the transfer stage in order to determine a direction of movement of the transfer stage.

The above objects of the present invention are also a transfer apparatus comprising: two pairs of links, each of the pairs of links having two arms joined together by means of one of a first pair of rotary shafts; a driving unit; a second pair of driving shafts driven by the driving unit and attached to a first side of the two pairs of links; a third pair of rotary shafts attached to a second side of the two pairs of links opposite to the first side thereof; a transfer stage supported by the third pair of rotary shafts; and means for magnetically generating a force exerted on the transfer stage in order to determine a direction of movement of the transfer stage. The second pair of driving shafts is inclined with a vertical direction perpendicular to a transfer direction in which the transfer stage is moved, so that the driving shafts of the second pair forms an angle. One of the first pair of rotary shafts and one of the third pair of rotary shafts are parallel to one of the second pair of the driving shafts. The other one of the first pair of rotary shafts and the other one of the third pair of rotary shafts are parallel to the other one of the second pair of the driving shafts.

It is another object of the present invention to provide a transfer method capable of easily determining the direction of movement of a transfer stage.

This object of the present invention is achieved by a transfer method using a transfer apparatus comprising: two pairs of links, each of the pairs of links having two arms joined together by means of one of a first pair of rotary shafts; a driving unit; a second pair of driving shafts driven by the driving unit and attached to a first side of the two pairs of links; a third pair of rotary shafts attached to a second side of the two pairs of links opposite to the first side thereof; a transfer stage supported by the third pair of rotary shafts, said transfer method comprising the steps of: (a) magnetically generating a force exerted on the transfer stage in order to determine a direction of movement of the transfer stage; and (b) rotating the driving shafts to move the two pairs of links.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 2A:
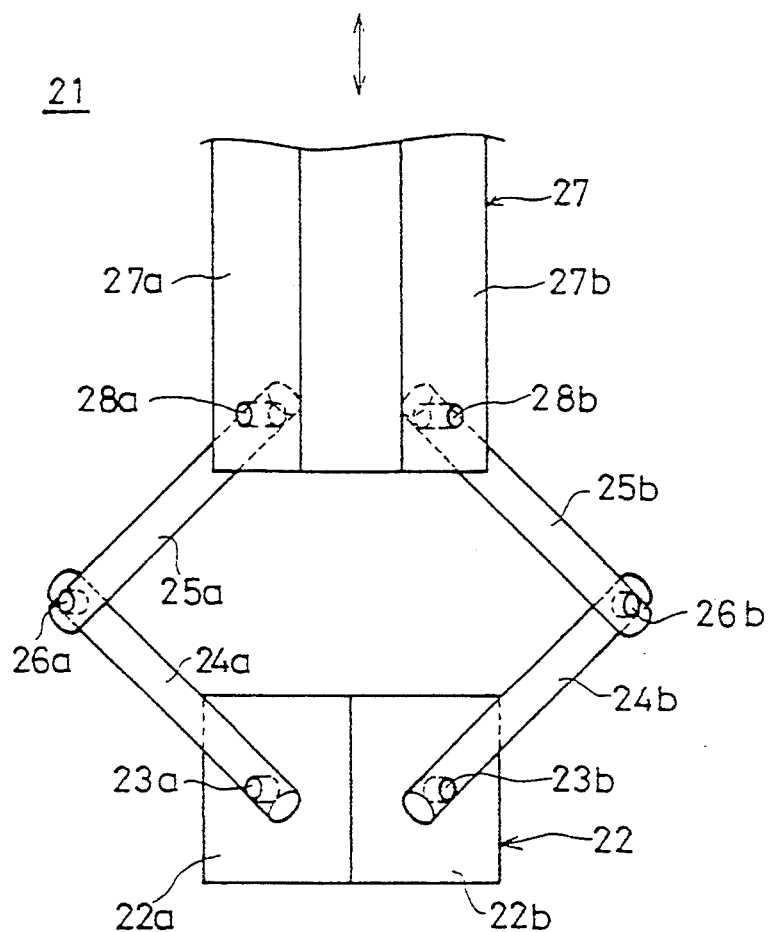
FIG. 2A is a plan view of a transfer apparatus according to a first embodiment of the present invention.
Figure 2B:
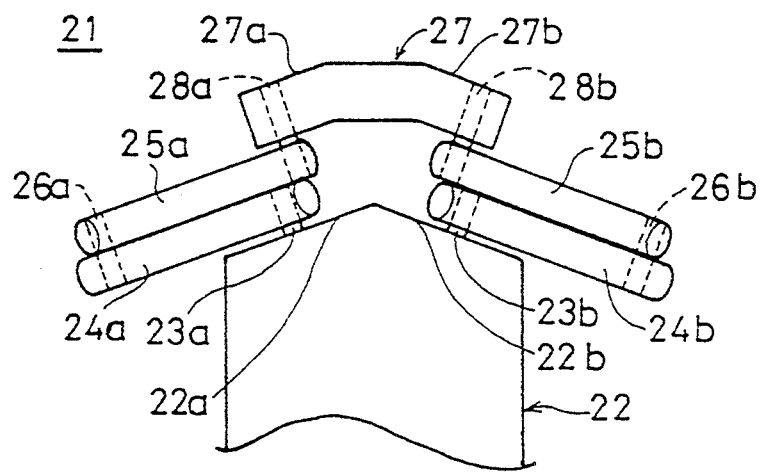
FIG. 2B is a side view of the transfer apparatus shown in FIG. 2A.

FIGS. 2A and 2B show a first embodiment of the present invention. More particularly, FIG. 2A is a plan view of an essential feature of a transfer apparatus according to the first embodiment of the present invention, and FIG. 2B is a side view thereof.

Referring to FIGS. 2A and 2B, a transfer apparatus 21 has a driving unit 22 having slope portions 22a and 22b formed at a top portion of the driving unit 22. Driving shafts 23a and 23b project from the slope portions 22a and 22b at a right angle with respect to the slope portions 22a and 22b. A pair of links are formed by an arm (support member) 24a and an arm (support member) 25a, which are joined together by means of a rotary shaft 26a. Another pair of links are formed by an arm (support member) 24b and an arm (support member) 25b, which are joined together by means of a rotary shaft 26b. Respective ends of the above two pairs of links are attached to the corresponding driving shafts 23a and 23b located on the right and left side portions of the driving unit 22.

A transfer stage 27 has slope portions 27a and 27b, which are inclined at the same angle as the slope portions 22a and 22b of the driving unit 22. The slope portions 27a and 27b are located on the right and left side portions of the transfer unit 27. Respective other ends of arms 25a and 25b are attached to rotary shafts 28a and 28b, which project from the slope portions 27a and 27b at a right angle with respect to the slope portions 27a and 27b. The rotary shafts 26a and 28a with respect to one of the two sets of links are parallel to the driving shaft 23a. Similarly, the rotary shafts 26b and 28b with respect to the other set of links are parallel to the driving shaft 23b.

The shafts 23a and 23b forms an angle identical to the angle formed by the shafts 26a and 26b and the angle formed by the shafts 28a and 28b.

The operation of the transfer apparatus 21 shown in FIGS. 2A and 2B will now be described with reference to FIGS. 3A and 3B, which respectively correspond to FIGS. 2A and 2B. The driving unit 22 rotates the driving shafts 23a and 23b in the opposite directions, and hence the transfer stage 27 can be moved in the directions indicated by an arrow A. The driving shafts 23a and 23b, the first pair of rotary shafts 26a and 26b, and the second pair of rotary shafts 28a and 28b are provided so that these shafts are inclined with respect to the vertical direction. Hence, the stop position of the transfer stage 27 can be defined.

Figure 3A:
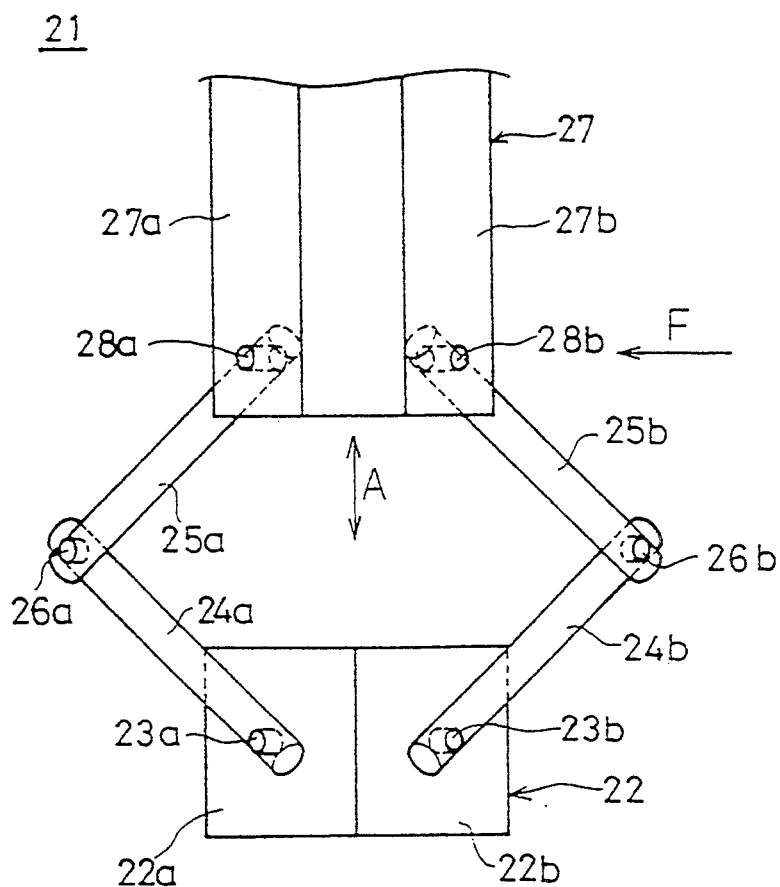
FIG. 3A is a plan view for explaining the operation of the transfer apparatus shown in FIGS. 2A and 2B.
Figure 3B:
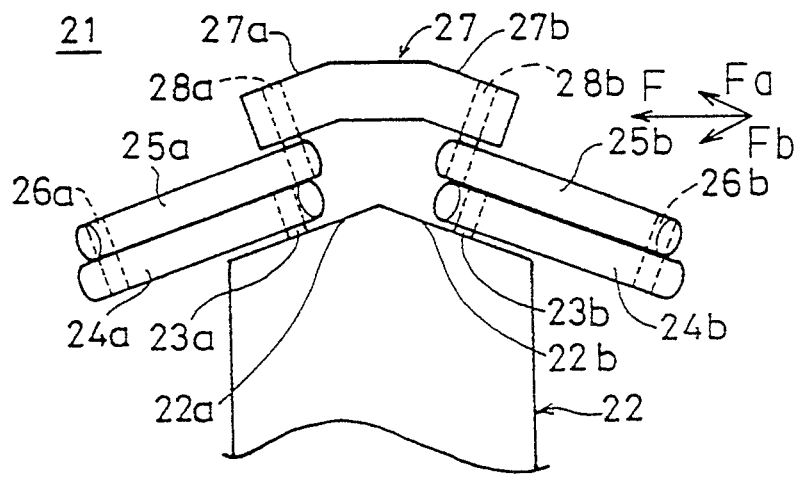
FIG. 3B is a side view for explaining the operation of the transfer apparatus shown in FIGS. 2A and 2B.

More specifically, if a force F indicated by an arrow in FIGS. 3A and 3B is exerted on the transfer stage 27, the force F can be divided into components Fa and Fb.

The force Fa functions to move the transfer stage 27 with respect to the rotary shaft 28b, while the force Fb functions to move the transfer stage 27 with respect to the rotary shaft 28a. Hence, the forces which function to move the transfer stage 28 do not coincide with each other, and the transfer stage 28 can be kept stationary at a current stop position. In the above manner, it becomes possible to realize the same function as that of gears without any gears supported by the transfer stage 27.

Since the transfer apparatus 21 does not need any gear supported by the transfer stage 27, the arms 24a, 24b, 25a and 25b supports only the transfer stage 27. That is, the arms 24a, 24b, 25a and 25b do not need to support any gears. Hence, the arms 24a, 24b, 25a and 25b are thick and stiff enough to support the transfer stage 27. Hence, it becomes possible to reduce a space within which the arms 24a, 24b, 25a and 25b and the transfer stage 27 are moved.

Figure 4:
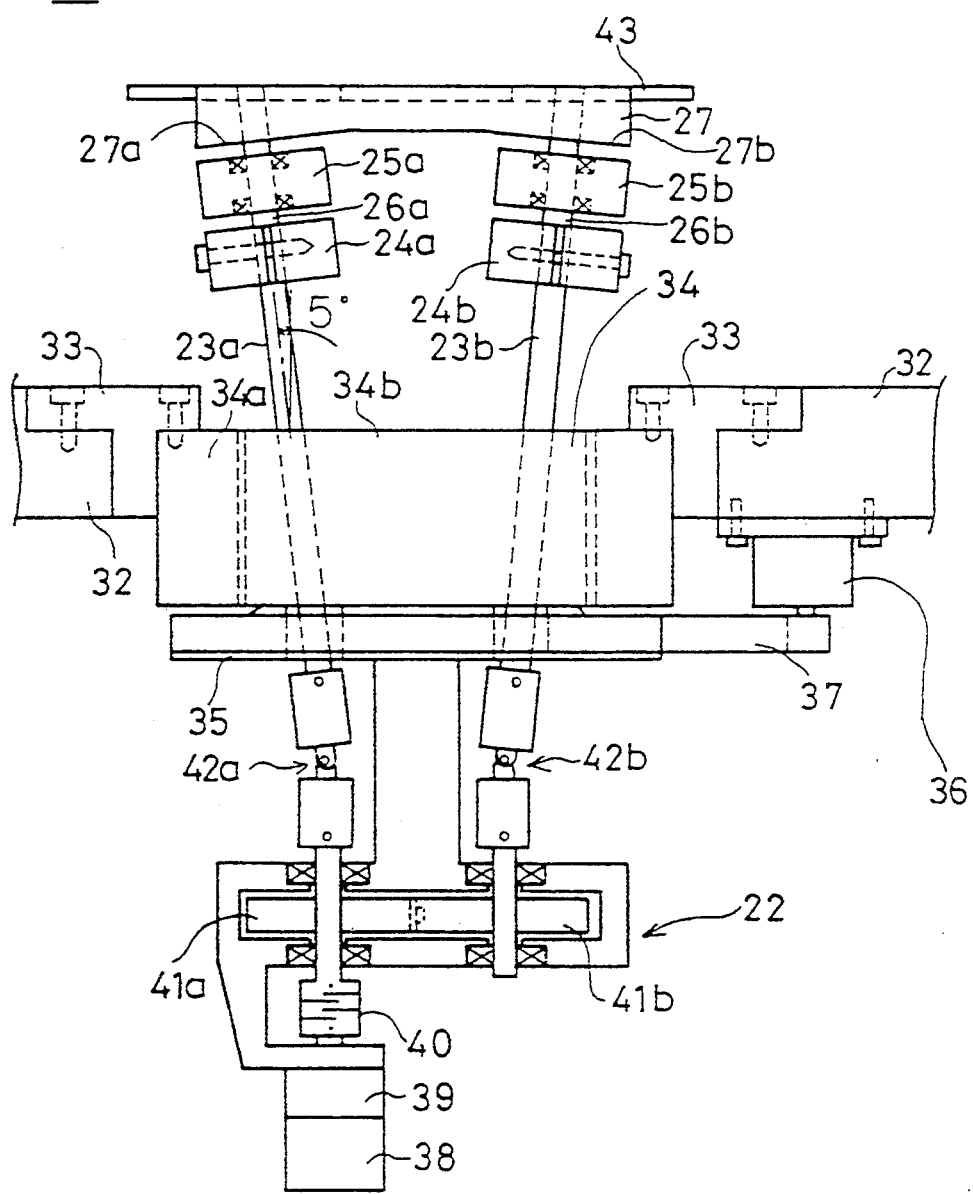
FIG. 4 is a side view of a wafer transfer apparatus to which the first embodiment of the present invention is applied.
Figure 5:
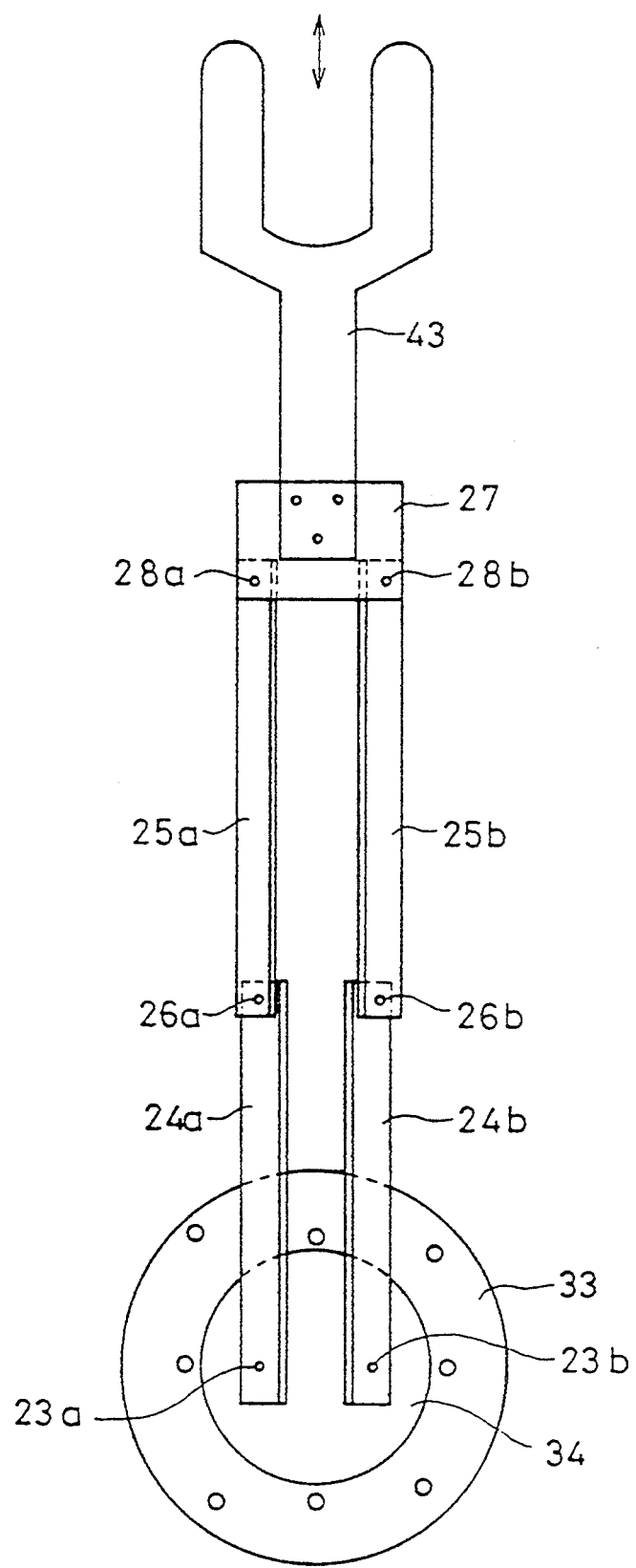
FIG. 5 is a plan view of the wafer transfer apparatus shown in FIG. 4.

FIG. 4 shows an application of the first embodiment of the present invention, and FIG. 5 is a plan view of the application shown in FIG. 4. In FIGS. 4 and 5, parts that are the same as those shown in FIGS. 2A, 2B, 3A and 3B are given the same reference numbers.

A transfer apparatus 31 shown in FIGS. 4 and 5 is used to transfer a wafer in a vacuum. A vacuum chamber 32 separates a vacuum side and an atmosphere side from each other. A circular flange 33 is attached to the vacuum chamber 32, and a magnetic liquid seal 34 having a multi-axis mechanism is attached to the flange 33. The flange 33 and the seal 34 keep the vacuum side vacuum at a degree of vacuum of, for example, $10^{-8}$ torr. The magnetic liquid seal 34 has an outer circular portion 34a fixed to the flange 33, and an inner circular portion 34b to which a pulley 35 is attached. A stepping motor 36 attached to the vacuum chamber 32 rotates the inner circular portion 34b of the seal 34 via a timing belt 37.

On the atmosphere side, a rotary shaft of a speed reduction device 39 (for example, a reduction ratio is 1:50) attached to the stepping motor 38 rotates a gear 41a via a coupling 40, and the gear 41a rotates a second gear 41b. The driving unit 22 includes the above-mentioned stepping motor 38, the reduction device 39, the coupling 40, the first gear 41a and the second gear 41b. The first gear 41a and the second gear 41b function to coincide the turning angles of the driving shafts 23a and 23b with each other, and are formed by gears having no backlash.

The first gear 41a is connected to a universal joint 42a to which the driving shaft 23a is connected. The driving shaft 23a penetrates an inner portion 34b of the magnetic liquid seal 34 and extends to the vacuum side. The second gear 41b is connected to a universal joint 42b to which the driving shaft 23b is connected. The driving shaft 23b penetrates the inner portion 34b of the magnetic liquid seal 34 and extends to the vacuum side. Universal joints having no backlash are used as the universal joints 42a and 42b. In the structure shown in FIGS. 4 and 5, the driving shafts 23a and 23b are inclined at an angle of 5° with respect to the vertical direction.

On the vacuum side, the driving shafts passing through the inner portion 34b of the magnetic liquid seal 34 are connected to respective ends of the first pair of arms 24a and 24b. As shown in FIG. 5, other ends of the arms 24a and 24b are respectively joined to the arms 25a and 25b by means of the rotary shafts 26a and 26b. Further, other ends of the arms 25a and 25b are respectively joined to the slope portions 27a and 27b by means of the rotary shafts 28a and 28b. The rotary shafts 26a and 28a are inclined at an angle of 5° with respect to the vertical direction, and are parallel to the driving shaft 23a. Similarly, the rotary shafts 26b and 28b are inclined at an angle of 5° with respect to the vertical direction, and are parallel to the driving shaft 23b. A hand 43 is connected to the transfer stage 27, and a wafer (not shown) is placed on the hand 43 and is transferred.

In the operation of the transfer apparatus 31, when the stepping motor 38 is rotated, the first and second gears 41a and 41b are rotated and the driving shafts 23a and 23b are thus rotated via the universal joints 42a and 42b. In this manner, the hand 43 can be moved in the directions shown in FIG. 5. When the driving shafts 23a and 23b are respectively rotated by 180°, the arms 24a, 24b, 25a and 25b are changed to a stretched state, as shown in FIG. 5.

The shaft-to-shaft distance between the driving shafts 23a and 23b and the rotary shafts 26a and 26b are set to be equal to or less than the shaft-to-shaft distance between the rotary shafts 26a and 26b and the rotary shafts 28a and 28b. In this case, the length of the arms 24a and 24b is equal to or less than that of the arms 25a and 25b. This is intended to definitely determine the direction of movement of the rotary shafts 28a and 28b. If the rotary arms 28a and 28b are located closer to the driving shafts 23a and 23b than the rotary shafts 26a and 26b in a state in which the arms 24a, 24b, 25a and 25b are maintained in a completely contracted state, the directions of rotations of the rotary shafts 28a and 28b cannot be identified in the next transfer operation.

Figure 6:
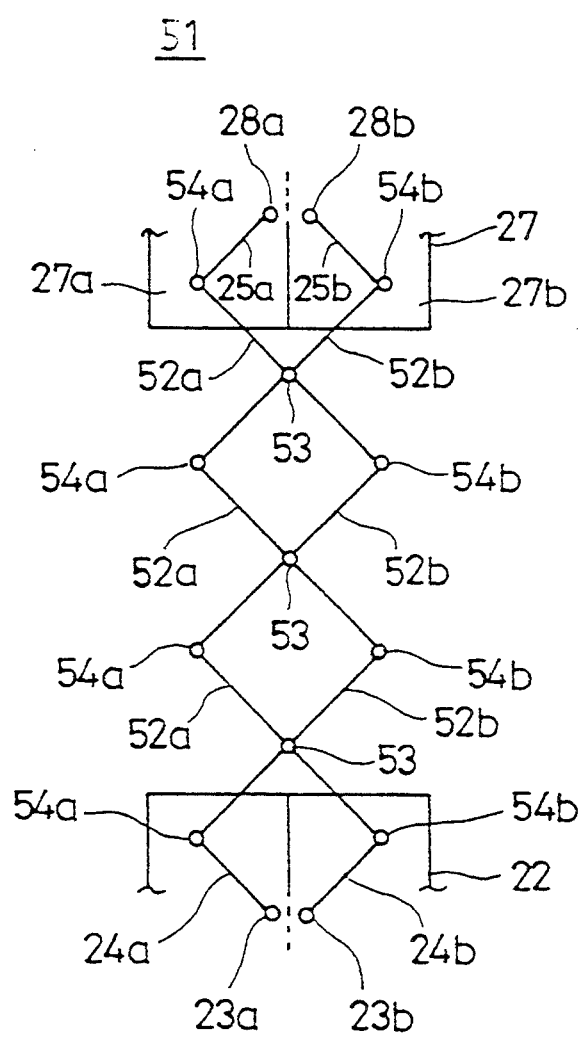
FIG. 6 is a plan view of a transfer apparatus according to a second embodiment of the present invention.

FIG. 6 shows a second embodiment of the present invention. A transfer apparatus 51 shown in FIG. 6 uses three pairs of links. Each of the three pairs of links includes a pair of arms 52a and 52b, which are joined together by means of an intermediate rotary shaft 53. The three pairs of links are sequentially joined by means of rotary shafts 54a and 54b. The arms 24a and 24b attached to the driving shafts 23a and 23b supported by the slope portions 22a and 22b of the driving unit 22 are connected, by means of a pair of rotary shafts 54a and 54b, to one-side ends of the three-pair link structure including the three pairs of links. The arms 25a and 25b attached to the rotary shafts 28a and 28b supported by the slope portions 27a and 27b of the transfer stage 27 are connected, by means of a pair of rotary shafts 54a and 54b, to other-side ends of the three-pair link structure. In the above manner, the transfer apparatus of so-called a pantograph-type is configured.

It will be noted that the intermediate rotary shafts 53 extend in the vertical direction and that the rotary shafts 54a are inclined with respect to the intermediate shaft 53 and are parallel to the driving shaft 23a and the rotary shaft 28a. Further, the rotary shafts 54b are inclined with respect to the intermediate shaft 53 and are parallel to the driving shaft 23b and the rotary shaft 28b.

Figure 1A:
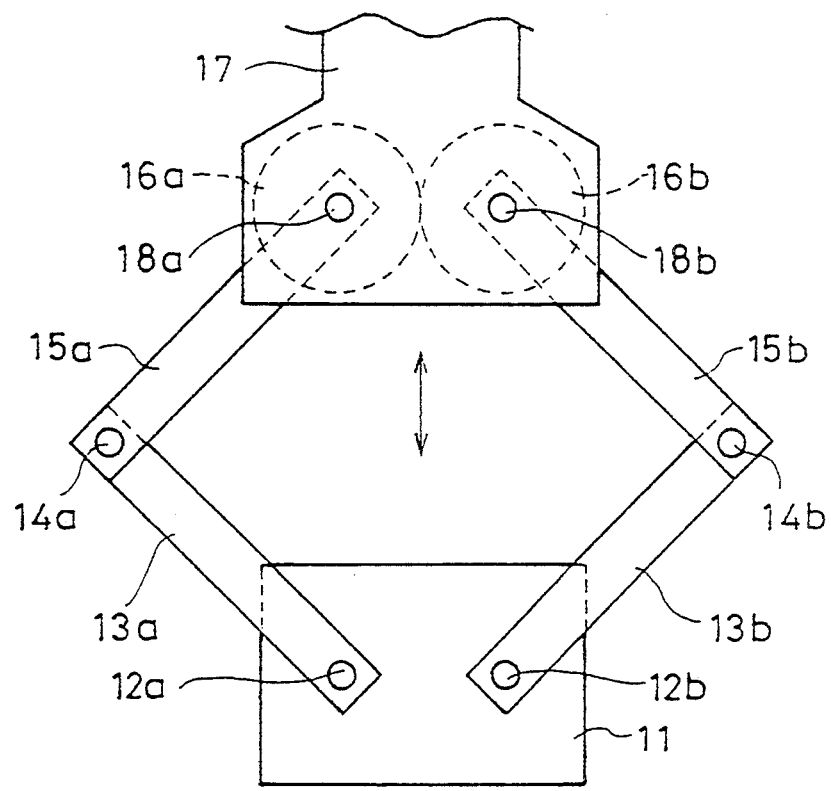
FIG. 1A is a plan view of an essential part of a conventional wafer transfer apparatus.
Figure 1B:
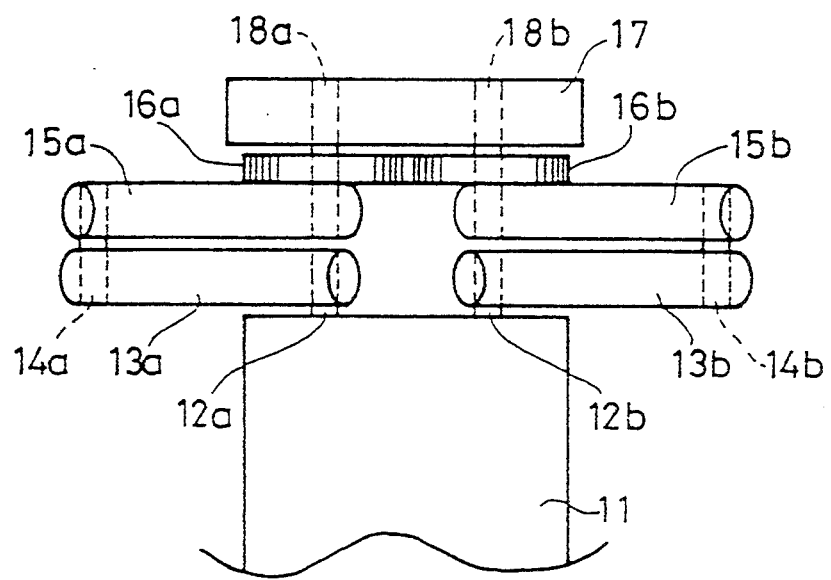
FIG. 1B is a side view of the conventional wafer transfer apparatus shown in FIG. 1A.

It will be noted that the pantograph-type transfer apparatus shown in FIGS. 5 and 6 do not need any gears as shown in FIG. 1.

A description will now be given of a third embodiment of the present invention. The third embodiment is intended to improve the following situation. In the above-mentioned first and second embodiments of the present invention, when it is required that the links made up of the arms 24a, 24b, 25a and 25b are stretched and contracted not only on the upper (first) side of the driving unit 22 in FIG. 3A but also on the lower (second) side thereof, it is necessary to, for example, turn the driving unit 22 by 180° so that the arms 24 are located on the lower (second) side of the driving unit 22. However, it takes a long time to turn the driving unit 22 and it is difficult to obtain a high throughput. Further, it is necessary to use gears to realize the above turning operation. In this case, particles due to the engagement of gears will occur.

The third embodiment is intended to make it possible to easily switch the stretching and contracting direction of the arms without turning the arms by 180° and without any particles.

Figure 7A:
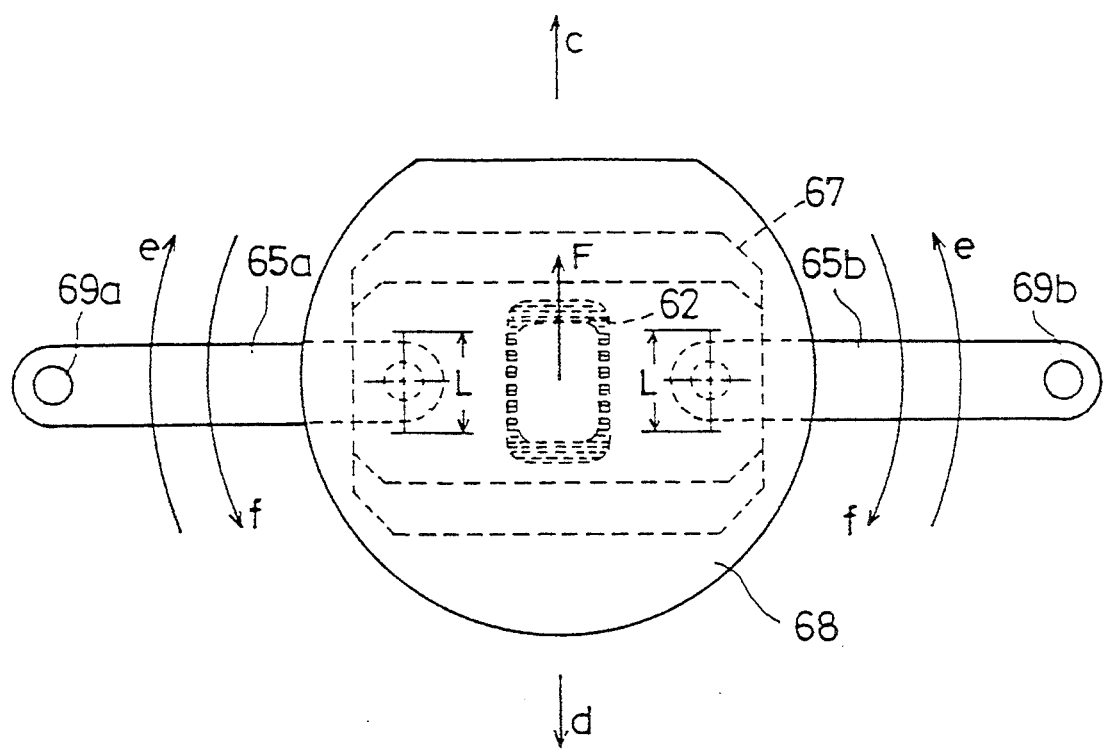
FIG. 7A is a plan view of a transfer apparatus according to a third embodiment of the present invention.
Figure 7B:
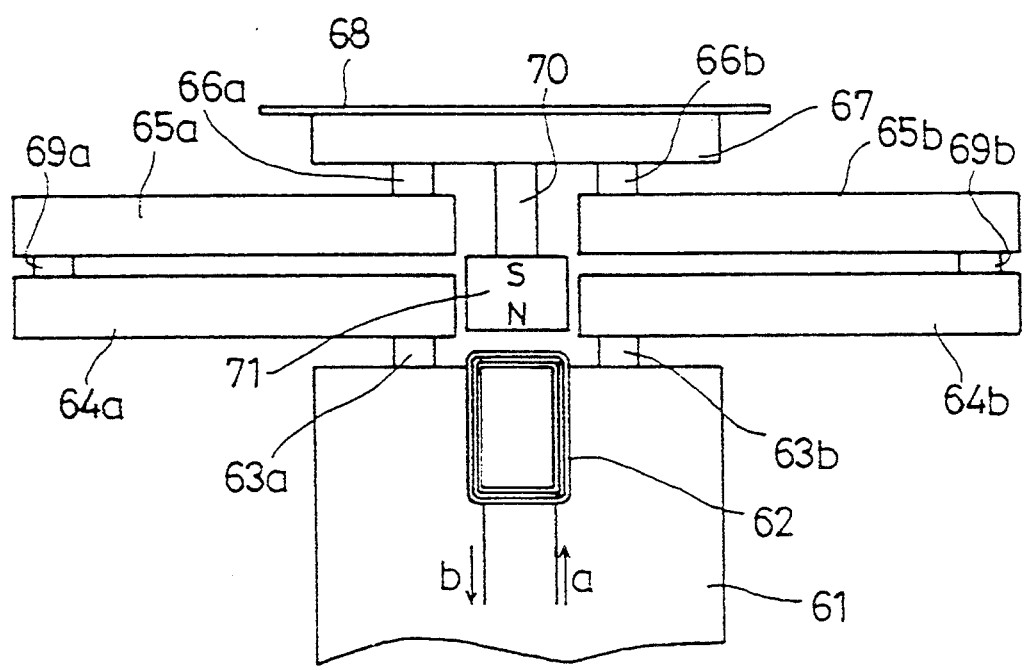
FIG. 7B is a side view of the transfer apparatus shown in FIG. 7A.

FIG. 7A is a plan view of an essential part of a transfer apparatus according to the third embodiment of the present invention, and FIG. 7B is a side view thereof. The transfer apparatus shown in FIGS. 7A and 7B has a driving unit 61, having an upper horizontal surface from which two driving shafts 63a and 63b project. Respective ends of a first pair of arms 64a and 64b are attached to the driving shafts 63a and 63b. The driving unit 61 has a coil 62, which is supplied with a current from an external circuit (not shown) in a direction (from "a" to "b" or "b" to "a") depending on the stretching and contracting direction.

Other ends of the arms 64a and 64b are joined to respective ends of arms 65a and 65b by means of rotary shafts 69a and 69b, respectively. The other ends of the arms 65a and 65b are connected to a wafer transfer stage 67 by means of rotary shafts 66a and 66b. A wafer 68 is placed on the transfer stage 67. A rod 70 extends downwards from the transfer stage 67, and a permanent magnet 71 is attached to a lowermost end of the rod 70. The permanent magnet 71 and the coil face each other in a state in which the arms 64a and 65a overlap each other and the arms 64b and 65b overlap each other (in the contracted state). The coil 62 and the permanent magnet 71 forms a linear motor.

A pair of links is formed by the arms 64a and 65a, and another pair of links is formed by the arms 64b and 65b. The lengths of the arms 64a, 64b, 65a and 65b are the same as each other, and the shaft-to-shaft distance between the driving shafts 63a and 63b and the rotary shafts 69a and 69b are equal to the shaft-to-shaft distance between the rotary shafts 69a and 69b and the rotary shafts 66a and 66b.

As shown in FIG. 7B, the shafts 63a and 66a are located on the same straight line, and the shafts 63b and 66b are also located on the same straight line in the state in which the links made up of the arms 64a, 65a, 64b and 65b are contracted. In the above contacted state, the position of the transfer stage 67 is not be changed even when the driving shafts 63a and 63b are rotated.

As shown in FIG. 7A, the shafts 66a and 66b are slightly movable in the transfer direction with respect to the arms 64a and 64b, in other words, with respect to the shafts 63a and 63b. Such a movable range is indicated by a reference "L" shown in FIG. 7A. In order to realize the movable range L, the shafts 69a and 69b are provided so that these shafts have slight backlashes and are slightly movable in the transfer direction.

When a current is made to flow in the coil 62 in the direction from "a" to "b", a force F is exerted on the permanent magnet 71 attached to the transfer stage 67. Hence, the shafts 66a and 66b are slightly moved in the direction in which the force F is exerted on the permanent magnet 71. In this state, when the shafts 63a and 63b are moved in a direction indicated by an arrow e shown in FIG. 7A, the transfer stage 67 is moved in a direction indicated by an arrow c. When the transfer stage 67 is moved in a direction indicated by an arrow d, the current is made to flow in the coil 62 in the reverse direction from "b" to "a". Hence, a force is directed in the direction opposite to that of the force F, and the shafts 66a and 66b are slightly moved by the above force opposite to the force F shown in FIG. 7A. In this state, when the shafts 63a and 63b are rotated in a direction indicated by an arrow f shown in FIG. 7A, the transfer stage 67 is moved in a direction indicated by the arrow d.

As described above, according to the third embodiment of the present invention, it is possible to stretch and contract the links using the arms 64a, 64b, 65a and 65b, each having the same shaft-to-shaft distance.

Figure 8:
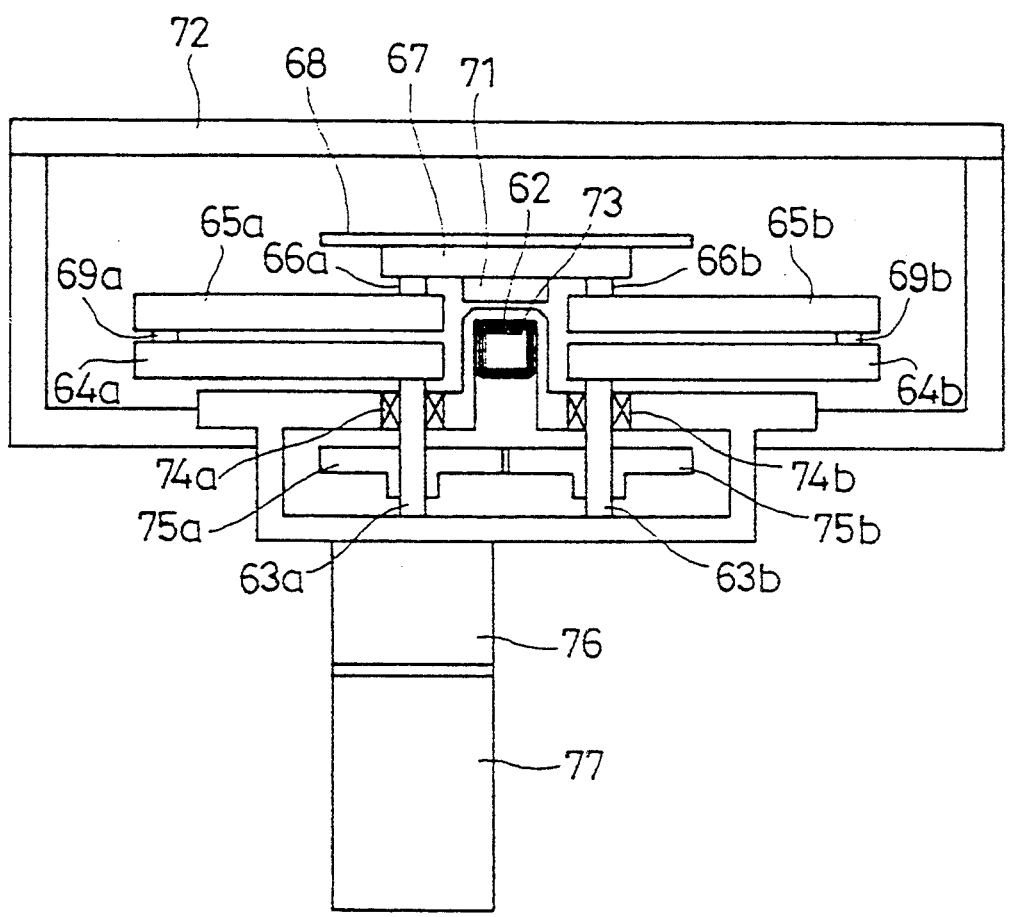
FIG. 8 is a side view of a wafer transfer apparatus to which the third embodiment of the present invention is applied.

FIG. 8 is side view of a wafer transfer apparatus to which the third embodiment of the present invention is applied. In FIG. 8, parts that are the same as parts shown in FIGS. 7A and 7B are given the same reference numbers. The wafer transfer apparatus transfers a wafer in the vacuum as in the case of the wafer transfer apparatus 31 shown in FIG. 4. A vacuum chamber 72 is isolated from the atmosphere and is kept vacuum at a degree of vacuum of, for example, $10^{-8}$ torr. The transfer apparatus shown in FIGS. 7A and 7B is accommodated in the vacuum chamber 72.

On the atmosphere side, a speed reduction device 76 (a reduction ratio is, for example, 1:50) attached to a stepping motor 77 rotates a first gear 75a, which rotates a second gear 75b. The reduction device 76, the stepping motor 77, the first gear 75a and the second gear 75b form the driving unit 61. The first gear 75a and the second gear 75b function to coincide the turning angles of the driving shafts 63a and 63b with each other, and are formed by gears having no backlash.

The driving shaft 63a to which the first gear 75a is attached penetrates an inner portion of a bearing/seal 74a, and extends to the vacuum side. The driving shaft 63b to which the second gear 75b is attached penetrates an inner portion of a bearing/seal 74b, and extends to the vacuum side. The driving shafts 63a and 63b extend in the vertical direction.

On the vacuum side, the driving shafts 63a and 63b respectively projecting from the bearing/seals 74a and 74b are attached to respective ends of the arms 64a and 64b. The other ends of the arms 64a and 64b are joined to the arms 65a and 65b by means of the rotary shafts 69a and 69b, respectively. The other ends of the arms 65a and 65b are connected to the transfer stage 67 by means of the rotary shafts 66a and 66b. In the structure shown in FIG. 8, the permanent magnet 71 is directly attached to the transfer stage 67.

An iron piece 73 is inserted into the coil 62 in order to enhance the magnetic force. In the structure shown in FIG. 8, the coil 62 is located between the arms 64a and 65a and the arms 64b and 65b.

In the transfer apparatus shown in FIG. 8, the transfer stage 67 can be moved in the direction c or the direction d shown in FIG. 7A from the position shown in FIGS. 7A and 7B by rotating the stepping motor 77 and to thereby rotate the driving shafts 63a and 63b via the first gear 75a and the second gear 75b.

Figure 9:
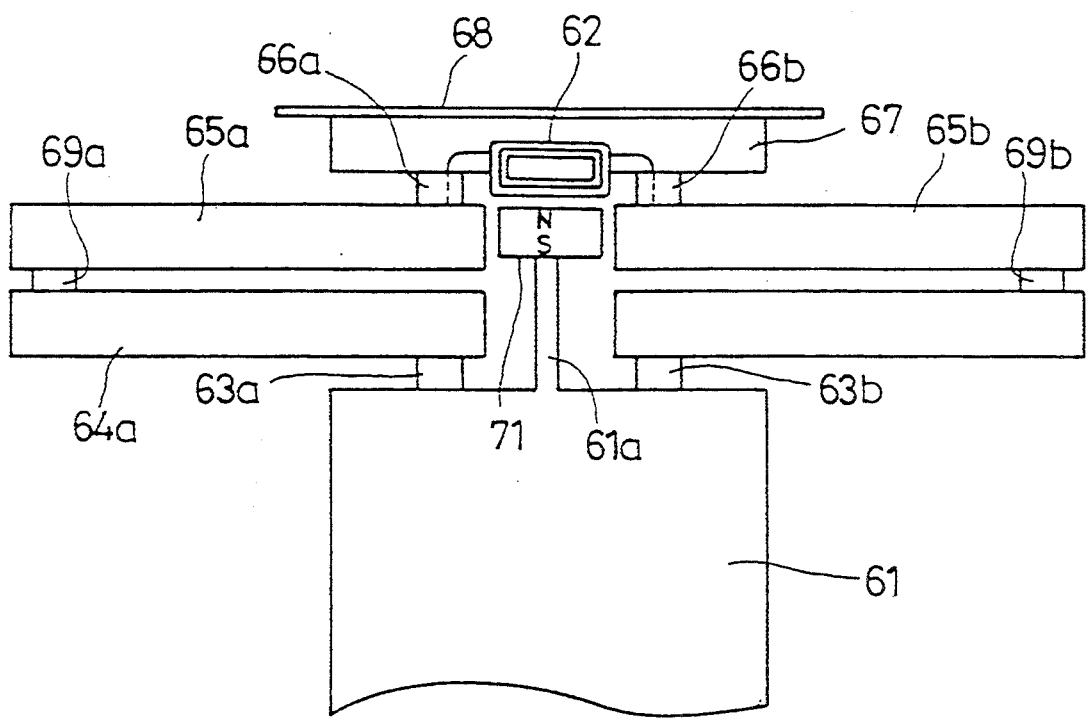
FIG. 9 is a side view of a variation of the third embodiment of the present invention.

FIG. 9 shows a variation of the transfer apparatus shown in FIGS. 7A and 7B. In FIG. 9, parts that are the same as those shown in FIGS. 7A and 7B are given the same reference numbers. In the transfer apparatus shown in FIG. 9, the coil 62 is attached to the transfer stage 67, and the permanent magnet 71 is attached to the driving unit 61. The permanent magnet 71 is supported by a projection 61a projecting from the upper surface of the driving unit 61. Lead wires of the coil 62 pass into the rotary shafts 66a and 66b and extend outside of the transfer apparatus. In the transfer apparatus shown in FIG. 9, it is possible to move the transfer stage in the direction c or d shown in FIGS. 7A and 7B by switching the direction of the current flowing in the coil 62.

In the structures shown in FIGS. 7A, 7B, 8 and 9, a secondary conductor, such as aluminum, can be used instead of the permanent magnet 71. By flowing the current in the coil 62, an eddy current is generated in the secondary conductor, which functions as the permanent magnet 71.

Figure 10:
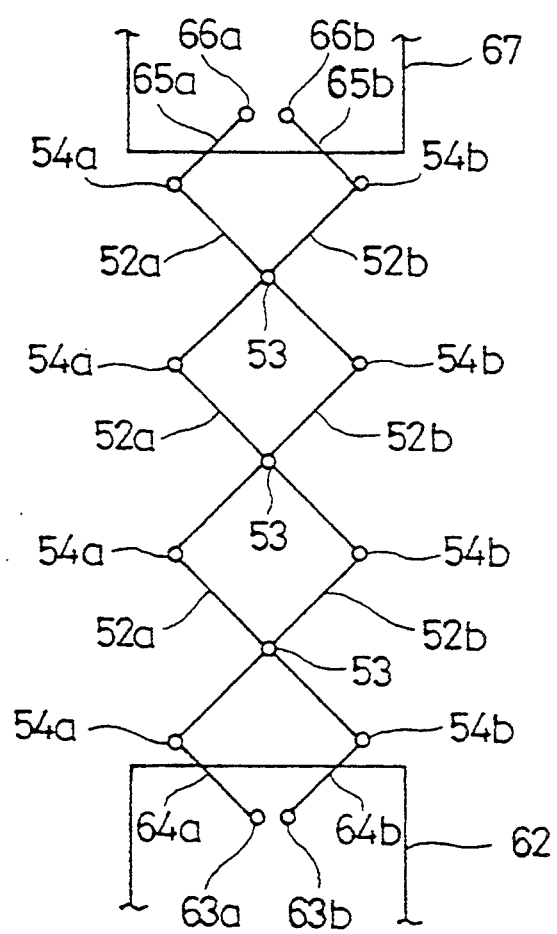
FIG. 10 is a plan view of a transfer apparatus according to a fourth embodiment of the present invention.

It is also possible to provide a pantograph-type transfer apparatus using the mechanism shown in FIGS. 7A and 7B or FIG. 9 as in the case of the pantograph-type transfer apparatus shown in FIG. 6. Such a pantograph-type transfer apparatus is illustrated in FIG. 10 as a fourth embodiment of the present invention. In FIG. 10, parts that are the same as those shown in the previously described figures are given the same reference numbers.

The arms 64a and 64b respectively attached to the driving shafts 63a and 63b supported by the driving unit 62 are connected to ends of the aforementioned three-pair link structure by means of the rotary shafts 54a and 54b. The arms 65a and 65b respectively attached to the rotary shafts 66a and 66b supported by the transfer stage 67 are connected to other ends of the three-pair link structure by means of the rotary shafts 54a and 54b. The links can be stretched and contracted on either side of the driving unit 62 and can be driven in either direction from the completely contracted state. The rotary shafts 54a and 54b extend vertically as in the case of the other shafts.

Figure 11:
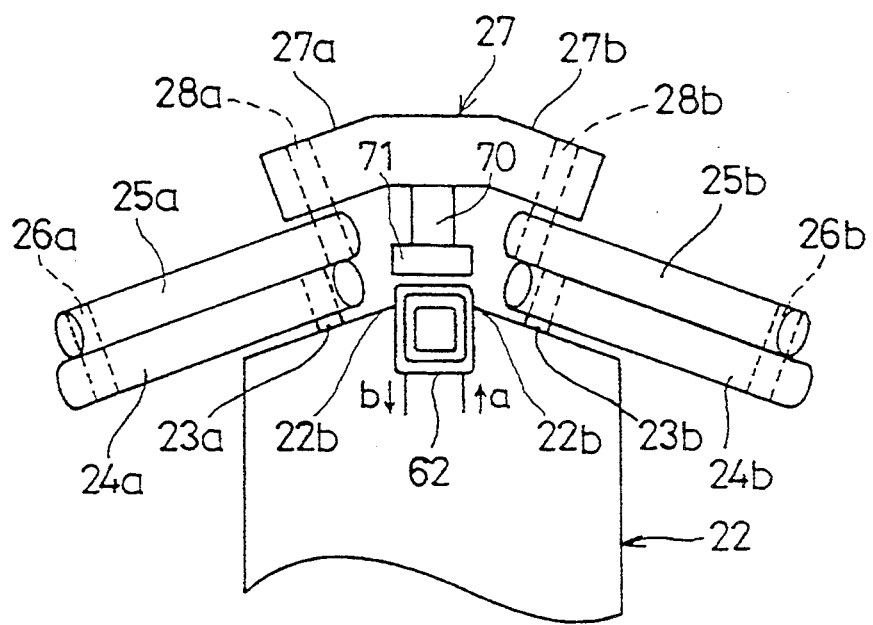
FIG. 11 is a side view of a transfer apparatus according to a fifth embodiment of the present invention.

It is possible to combine the first and third embodiments of the present invention together. Such a combination is illustrated in FIG. 11 as a fifth embodiment of the present invention. In FIG. 11, parts that are the same as those shown in the previously described figures are given the same reference numbers. In the structure shown in FIG. 11, the coil 62 is attached to the driving unit 22, and the permanent magnet 71 is attached to the transfer stage 27. It is also possible to attach the coil 62 and the permanent magnet 71 to the transfer stage 62 and the driving unit 22, respectively.

The present invention is not limited to the specifically disclosed embodiments, and variations and modifications may be made without departing from the scope of the present invention.

What is claimed is:

1. A transfer apparatus for moving a transfer stage in a transfer direction, comprising:
    a first pair of shafts;
    two pairs of links, each pair of links comprising two arms joined together by a corresponding respective shaft of the first pair of shafts and having a first end and a second end;
    a driving unit;
    a second pair of shafts which are driven by the driving unit, each shaft of the second pair of shafts corresponding to a respective pair of links of the two pair of links and being attached to the first end of the corresponding pair of links;
    a third pair of shafts, each shaft of the third pair of shafts corresponding to a respective pair of links of the two pair of links and being attached to the second end of the corresponding pair of links; and
    a transfer stage supported by the third pair of shafts, wherein:
        the second pair of shafts is inclined with respect to a direction which is perpendicular to the transfer direction, to form an angle between the respective shafts of the second pair of shafts,
        one shaft of the first pair of shafts, one shaft of the third pair of shafts and one shaft of the second pair of shafts are parallel to each other, and
        the other shaft of the first pair of shafts, the other shaft of the third pair of shafts and the other shaft of the second pair of shafts are parallel to each other.

2. The transfer apparatus as claimed in claim 1, wherein, for each pair of links, the distance between the corresponding shaft of the second pair of shafts and the corresponding shaft of the first pair of shafts is equal to or less than the distance between the corresponding shaft of the first pair of shafts and the corresponding shaft of the third pair of shafts.

3. A transfer apparatus for moving a transfer stage in a transfer direction, comprising:
    an intermediate link structure which is stretchable and contractible and comprises a plurality of pairs of links, each pair of links having a pair of arms joined together by a corresponding, respective intermediate rotary shaft, the intermediate link structure having a first end and a second end;
    a first pair of arms rotatably coupled to the first end of the intermediate link structure;
    a second pair of arms rotatably coupled to the second end of the intermediate link structure;
    a driving unit;
    a first pair of shafts driven by the driving unit and attached to the first pair of arms;
    a second pair of shafts attached to the second pair of arms; and
    a transfer stage supported by the second pair of shafts, wherein:
        the first pair of shafts is inclined with respect to a direction perpendicular to the transfer direction, to form an angle between the respective shafts of the first pair of shafts, and
        one shaft of the second pair of shafts is parallel to one shaft of the first pair of shafts and the other shaft of the second pair of shafts is parallel to the other shaft of the first pair of shafts.

4. A transfer apparatus for moving a transfer stage in a transfer direction, comprising:
    a first pair of shafts;
    two pairs of links, each pair of links comprising two arms joined together by a corresponding, respective shaft of the first pair of shafts and having a first end and a second end;
    a driving unit;
    a second pair of shafts which are driven by the driving unit, each shaft of the second pair of shafts corresponding to a respective pair of links of the two pair of links and being attached to the first end of the corresponding pair of links;
    a third pair of shafts, each shaft of the third pair of shafts corresponding to a respective pair of links of the two pair of links and being attached to the second end of the corresponding pair of links;
    a transfer stage supported by the third pair of shafts; and magnetic means for magnetically exerting a force on the transfer stage, to slightly move the transfer stage in the transfer direction.

5. The transfer apparatus as claimed in claim 4, wherein the magnetic means comprises:
   a coil attached to the driving unit; and
   a permanent magnet attached to the transfer stage so that the permanent magnet is adjacent to the coil when the two pairs of links are completely contracted.

6. The transfer apparatus as claimed in claim 4, wherein the magnetic means comprises:
   a coil attached to the driving unit; and a secondary conductor attached to the transfer stage so that the secondary conductor is adjacent to the coil when the two pairs of links are completely contracted.

7. The transfer apparatus as claimed in claim 4, wherein the magnetic means comprises:
   a permanent magnet attached to the driving unit; and
   a coil attached to the transfer stage so that the coil is adjacent to the permanent magnet when the two pairs of links are completely contracted.

8. The transfer apparatus as claimed in claim 4, wherein the magnetic means comprises:
   a secondary conductor attached to the driving unit; and
   a coil attached to the transfer stage so that the coil is adjacent to the secondary conductor when the two pairs of links are completely contracted.

9. A transfer apparatus for moving a transfer stage in a transfer direction, comprising:
   an intermediate link structure which is stretchable and contractible and comprises a plurality of pairs of links, each pair of links having a pair of arms joined together by a corresponding, respective intermediate rotary shaft, the intermediate link structure having a first end and a second end;
   a first pair of arms rotatably coupled to the first end of the intermediate link structure;
   a second pair of arms rotatably coupled to the second end of the intermediate link structure;
   a driving unit;
   a first pair of shafts driven by the driving unit and attached to the first pair of arms;
   a second pair of shafts attached to the second pair of arms;
   a transfer stage supported by the second pair of shafts; and
   magnetic means for magnetically exerting a force on the transfer stage, to slightly move the transfer stage in the transfer direction.

10. A transfer apparatus for moving a transfer stage in a transfer direction, comprising:
    a first pair of shafts;
    two pairs of links, each pair of links comprising two arms joined together by a corresponding, respective shaft of the first pair of shafts;
    a driving unit;
    a second pair of shafts which are driven by the driving unit, each shaft of the second pair of shafts corresponding to a respective pair of links of the two pair of links and being attached to the first end of the corresponding pair of links;
    a third pair of shafts, each shaft of the third pair of shafts corresponding to a respective pair of links of the two pair of links and being attached to the second end of the corresponding pair of links;
    a transfer stage supported by the third pair of shafts; and
    magnetic means for magnetically exerting a force on the transfer stage, to slightly move the transfer stage in the transfer direction, wherein:
    the second pair of shafts is inclined with respect to a direction which is perpendicular to the transfer direction, to form an angle between the respective shafts of the second pair of shafts,
    one shaft of the first pair of shafts, one shaft of the third pair of shafts and one shaft of the second pair of shafts are parallel to each other, and
    the other shaft of the first pair of shafts, the other shaft of the third pair of shafts and the other shaft of the second pair of shafts are parallel to each other.

11. A method for moving a transfer stage of a transfer apparatus in a transfer direction, the transfer apparatus comprising a first pair of shafts, two pairs of links, each pair of links comprising two arms joined together by a corresponding, respective shaft of the first pair of shafts and having a first end and a second end, a driving unit, a second pair of shafts which are driven by the driving unit, each shaft of the second pair of shafts corresponding to a respective pair of links of the two pair of links and being attached to the first end of the corresponding pair of links, a third pair of shafts, each shaft of the third pair of shafts corresponding to a respective pair of links of the two pair of links and being attached to the second end of the corresponding pair of links, and a transfer stage supported by the third pair of shafts, the method comprising:
    magnetically exerting a force on the transfer stage, to slightly move the transfer stage in the transfer direction; and
    rotating the second pair of shafts to move the two pairs of links.

* * * * *